United States Patent
Fork et al.

(10) Patent No.: US 7,118,389 B2
(45) Date of Patent: Oct. 10, 2006

(54) STUD BUMP SOCKET

(75) Inventors: David K. Fork, Los Altos, CA (US);
Jurgen Daniel, Mountain View, CA (US)

(73) Assignee: Palo Alto Research Center Incorporated, Palo Alto, CA (US)

(*) Notice: Subject to any disclaimer, the term of this patent is extended or adjusted under 35 U.S.C. 154(b) by 48 days.

(21) Appl. No.: 10/871,330

(22) Filed: Jun. 18, 2004

(65) Prior Publication Data

US 2005/0282411 A1    Dec. 22, 2005

(51) Int. Cl.
*H01R 12/00* (2006.01)
(52) U.S. Cl. ...................................... 439/74
(58) Field of Classification Search ............ 439/74, 439/82; 174/254, 260–262, 265, 267; 361/769, 361/767, 772, 774, 777
See application file for complete search history.

(56) References Cited

U.S. PATENT DOCUMENTS

| | | | | |
|---|---|---|---|---|
| 5,802,699 | A * | 9/1998 | Fjelstad et al. | 29/593 |
| 5,812,378 | A * | 9/1998 | Fjelstad et al. | 361/769 |
| 6,374,487 | B1 * | 4/2002 | Haba et al. | 29/840 |
| 6,555,764 | B1 * | 4/2003 | Maruyama et al. | 174/267 |
| 6,837,721 | B1 * | 1/2005 | Soeta | 439/82 |

OTHER PUBLICATIONS

Jordan: "Gold Stud Bump In Flip-Chip Applications", Palomar Technologies, Inc., 2002, 4 pgs.
Yoon et al.: "RF Mems Based On Epoxy-Core Conductors", Solid-State Sensor, Actuator and Microsystems Workshop Hilton Head Island, South Carolina, Jun. 2-6, 2002, pp. 374-375.
Guerin: "3-D Multichip Modules And Microclip; A Simple And Low-Cost Vertical Interconnection Technique", SOTEC Microsystems, Jul. 14, 1997, 1 pg.

* cited by examiner

Primary Examiner—J. F. Duverne
(74) Attorney, Agent, or Firm—Bever, Hoffman & Harms, LLP; Patrick T. Bever

(57) ABSTRACT

A socket for solderless connection between a stud-bumped IC chip and a host PCB. The socket includes a three-dimensional (e.g., cylindrical or cubical) hollow metal frame that is either free-standing or supported by an underlying patterned template structure. The metal frame includes side walls that extend away from the host PCB, and a contact structure located at the upper (i.e., free) end of the side walls. The contact structure defines an opening through which a stud bump can be inserted into a central chamber of the metal frame. The side walls and/or the contact structure are formed such that when the tip end of the stud bump is inserted into the central chamber, at least one of the base structure and the sidewall of the stud bump abuts the contact structure at two or more contact points.

16 Claims, 10 Drawing Sheets

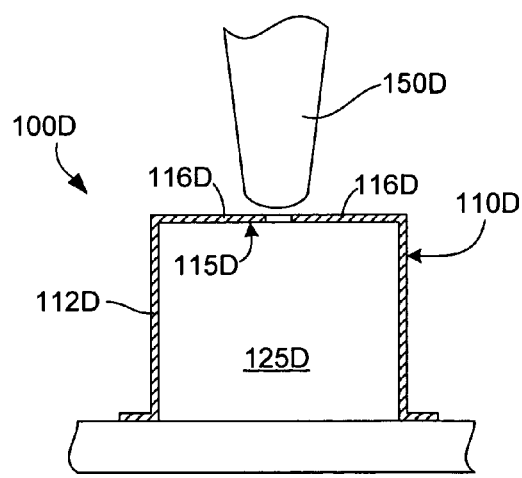 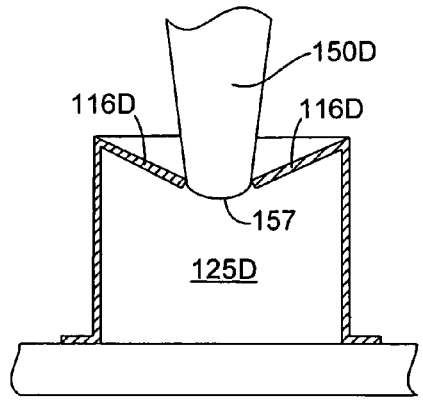
FIG. 13(A)  FIG. 13(B)
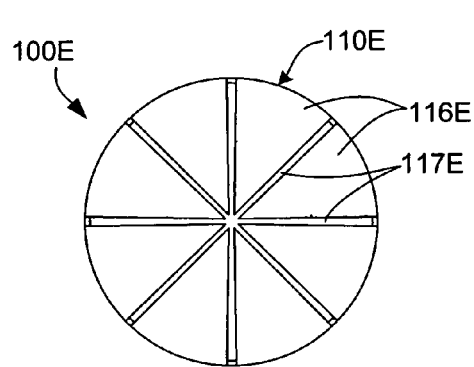 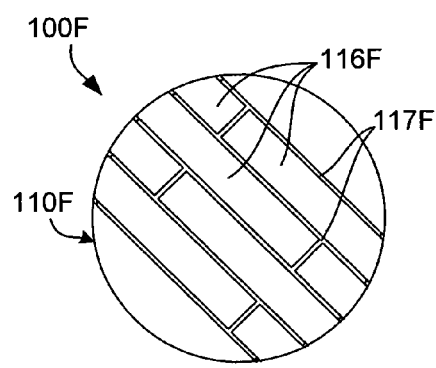
FIG. 14  FIG. 15

STUD BUMP SOCKET

FIELD OF THE INVENTION

This invention relates to integrated circuit (IC) devices, and more particularly to structures for connecting IC devices to host systems.

BACKGROUND OF THE INVENTION

Electronic packages are interconnectable housings for integrated circuit (IC) devices. Packaging is performed after a semiconductor wafer has been fabricated according to known semiconductor processing techniques, and then "diced" (i.e., cut) into individual IC "chips". Typically, packaging involves placing one or more IC chips into a package housing, electrically connecting the IC chip to contact pads formed on the housing, e.g., by wire bonding these contact pads to corresponding input/output (I/O) die bonding pads formed on the IC chip(s), and then covering the IC chip and wire bonds for protection. The housings typically include multiple leads, pins, or bumps that are connected by conductive traces to the contact pads, and are arranged in a predetermined pattern such that the packaged IC chip can be tested by applying test signals to the leads/pins/bumps using a test fixture. Faulty IC chips are thus identified and discarded, while IC chips that pass this testing process are subsequently mounted (e.g., soldered) onto a corresponding contact site of another host system printed circuit board (PCB). If a packaged IC subsequently fails, the faulty IC can be removed from the host system by heating the solder to remove the faulty IC, cleaning the PCB contact site, and then resoldering a new packaged IC onto the contact site.

A problem associated with the conventional practice of packaging IC chips prior to testing is that the process of packaging damaged or otherwise non-functional IC chips significantly increases overall production costs. Currently, there are few chip-scale socket solutions capable of testing IC chips prior to packaging. Instead, most IC test socket technology consists of zero insertion force (ZIF) sockets, which are designed to facilitate the insertion and removal of a dual in-line package or pin grid array package without special tools. As such, these conventional ZIF socket solutions require packaging of each IC chip before they can be used, which increases overall manufacturing costs and thus reduces profitability.

Therefore, compliant, reworkable IC chip connections are a highly desired technology for testing and burning in the IC chips prior to packaging. In addition to making assembly and rework simpler and faster, such connections could facilitate the circumvention of tariffs on imported computer parts (e.g., lap top computers can be shipped separately from their processors, and hence get taxed as parts rather than as completed computer systems).

Flip-chip technology is growing in popularity because of its high input/output density capability, increased chip-packaging density, and excellent electrical performance. Solder-bumped, flip-chip technology has been well established since IBM developed the C4 process. In this process, solder bumps were formed on under-bump metallurgy (UBM) pads on the chip and joined to matching metal pads on the substrate by a reflow process. Because the established technique involves difficult and expensive processes to implement, new low-cost techniques for flip chip connections were sought.

Recently, the stud-bump bonding (SBB) technology, which is based on the wire-bonding technology, has been developed as a very attractive solution for a low-cost flip-chip technology. With SBB technology, gold stud bumps are placed on the die bond pads of IC chips through a modification of the "ball bonding" process used in conventional wire bonding. In ball bonding, the tip of the gold bond wire is melted to form a sphere. The wire-bonding tool presses this sphere against the aluminum bond pad, applying mechanical force, heat, and ultrasonic energy to create a metallic connection. The wire-bonding tool next extends the gold wire to the connection pad on the board, substrate, or lead frame, and makes a "stitch" bond to that pad, finishing by breaking off the bond wire to begin another cycle. For gold stud bumping, the first ball bond is made as described, but the wire is then broken close above the ball. The resulting gold ball with truncated wire, or "stud bump", remains on the bond pad to provide a permanent, reliable connection through the aluminum oxide to the underlying metal. This technology has several advantages: UBM process is not necessary, bumping cost is low, and fine-pitch and chip-level bumping is possible.

Gold stud bump flip chip technology offers several advantages over conventional IC packaging. The bumping equipment, a wire bonder or dedicated stud bumper, is widely available and well characterized. Since stud bumps are formed by wire bonders, they can be placed anywhere a wire bond might be placed. They can easily achieve pitches of less than 100 microns and be placed on pads of less than 75 microns. Since stud bumping can be done on a wire bonder, it does not require wafers or under-bump metallization (UBM). Single, off-the-shelf die can be bumped and flipped without pre-processing. This makes the stud bump flip chip model fast, efficient, and flexible for product development, prototyping and low to medium volume production, while easy to scale up to high volume wafer-based production with automated equipment.

Although stud bumping is fairly well developed, what is not yet established is a connection socket that can receive stud bumps in a reliable and reworkable manner.

Therefore, what is needed is a compliant and reworkable connection socket for electrically connecting stud bumped IC devices to a host system (e.g., a testing system, or a PCB of an electronic device).

SUMMARY OF THE INVENTION

The present invention is directed to a socket that facilitates solderless connection of an electronic device (e.g., an integrated circuit (IC) chip) to a host system (e.g., a printed circuit "motherboard" of an electronic system such as a digital computer, or a printed circuit test board of a testing system). In particular, the present invention is directed to a socket that provides a reliable, reworkable electrical connection to a stud bump (or other metal wire column or similar metal structure extending from the electronic device) when the electronic device is mounted onto the host system. The present invention is also directed to an assembly including the electronic device and host system, and to an array of sockets arranged to receive a corresponding array of stud bumps.

According to an aspect of the invention, the socket includes a three-dimensional (e.g., cylindrical or cubical) hollow metal frame that is either supported by an underlying structure or free-standing that is formed by plating metal over a patterned template structure. The metal frame includes side walls that extend away from the underlying host substrate, and a contact structure located at the upper (i.e., free) end of the side walls. The contact structure defines an opening through which a stud bump can be inserted into a central chamber of the metal frame, which is surrounded by the side walls of the metal frame. The side walls and/or the contact structure are formed such that when the tip end of the stud bump is inserted into the central chamber, at least one of the base structure and the sidewall of the stud bump abuts the contact structure at two or more contact points, thereby ensuring that if one contact point has an intermittent loss of contact or increase in resistance, the other contact point(s) continue to handle the electrical load. Accordingly, the present invention provides a mechanism for electrically and mechanically connecting a "stud bumped" electronic device to a host system without solder, and with compliance that accommodates thermal expansivity mismatch, mechanical imperfections, and in a manner that adsorbs mechanical shock. In addition, the present invention facilitates reworking a packaged integrated circuit without having to heat the part, clean, and resolder.

According to an aspect of the present invention, socket fabrication includes forming a layer of negative-acting resist material (e.g., a negative, epoxy-based photoresist material such as SU-8, which is produced, for example, by Micro-Chem Corp. of Newton Mass., USA) adjacent to a contact pad exposed on a surface of the host system substrate (e.g., PCB), and then masking the upper surface of the negative-acting resist material layer such that a predetermined pattern of the resist material is exposed through the mask. The exposed negative-acting resist material is then illuminated through the patterned opening, thereby developing a region of the negative-acting material that corresponds to a desired patterned template structure. The developed regions of the negative-acting resist material exhibits reentrant sidewalls (i.e., such that the cross-section of the sidewall at the lower end is thinner than at the upper end). The non-exposed portion of the negative-acting resist material is then removed using known techniques, thereby exposing the patterned template structure. The metal frame is then plated over the exposed surface of the patterned template structure using known electroplating or electroless plating techniques. Thus, in this embodiment, the resulting socket utilizes a metal frame to provide electrical contact between the stud bump and the host system, and the patterned template structure to support the metal frame. According to an alternative embodiment, the patterned template structure is formed using an elastomeric material, such as Silicone (poly-dimethylsiloxane (PDMS)).

According to another embodiment, a socket includes a substantially cylindrical, relatively thick main wall surrounding a central cavity, and several relatively narrow, flexible membranes extending from the main wall into the central cavity. In one embodiment, the main wall and membranes are formed by fabricating a nonconductive, patterned template structure using, e.g., SU-8, and then made conductive by forming an external metal shell (frame) by electroplating or electroless plating. During subsequent use, the tip end of the stud bump enters the central chamber and contacts one or more of the membranes, causing the contacted membranes to bend toward the main wall. The lateral positioning accuracy of the stud bump can be more relaxed in this embodiment because of the relatively high flexibility of the membranes.

According to an alternative embodiment of the present invention, the patterned template structure is removed (e.g., dissolved or etched) after the metal frame is formed. In particular, a portion of the plating mask is formed on the patterned template structure to produce an opening that exposes the patterned template material after the plating process is completed. The patterned template material is then removed through this opening to produce a socket structure that includes only a free-standing metal frame on the host substrate, which provides a connector having less stress and more flexibility than the retained structure. In one exemplary embodiment, the free-standing metal frame includes dual, coaxial side walls that are separated by a groove, and the contact structure of the socket is provided by upper edges of the inner side wall. In other embodiments, the metal frame includes one or more contiguous vertical side walls surrounding a hollow central cavity, and a horizontal upper wall that defines several cantilevered contact structures having fixed ends connected to the side walls, and free ends extending over the central cavity. Slits or other openings are defined between the cantilevered contact structures, through which the sacrificial patterned template material is removed, e.g., by dissolution or plasma etching. During subsequent use, the tip end of the stud bump enters the central cavity by pressing downward against one or more of the cantilevered contact structures, causing the contacted structures to bend downward into the central cavity.

BRIEF DESCRIPTION OF THE DRAWINGS

These and other features, aspects and advantages of the present invention will become better understood with regard to the following description, appended claims, and accompanying drawings, where:

FIGS. 13(A) and 13(B) are cross sectional side views showing the socket of FIG. 12(C) during use;

FIG. 14 is a top plan view showing a socket according to another embodiment of the present invention; and FIG. 15 is a top plan view showing a socket according to yet another embodiment of the present invention.

DETAILED DESCRIPTION OF THE DRAWINGS

Figure 1:
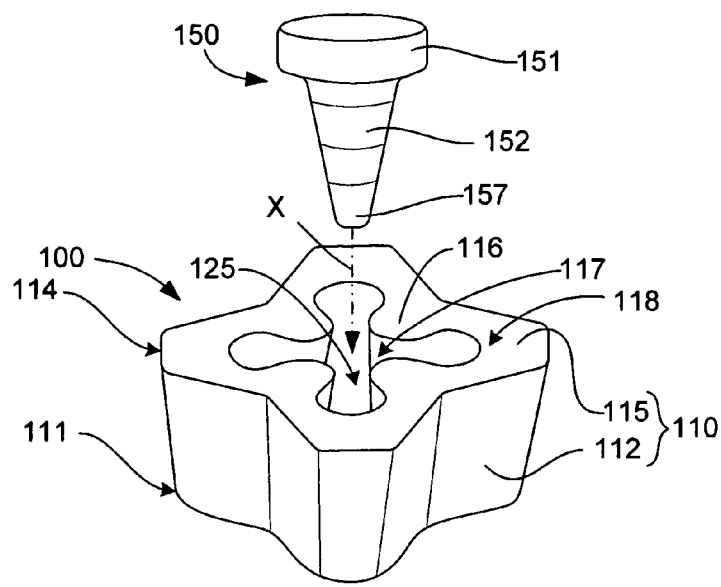
FIG. 1 is an exploded perspective view showing a socket and stud bump according to an embodiment of the present invention.

FIG. 1 is an exploded perspective view showing a socket 100 that makes sliding contact to a stud bump 150 according to an embodiment of the present invention. Referring to the upper portion of FIG. 1, stud bump 150 includes a relatively wide base section 151, an elongated (tapered) body 152 extending from base section 151, and a tip 157 located at a free (tip) end of elongated body 152. Stud bump 150 is formed according to modified wire-bonding techniques. Socket structure includes a metal frame 110 including at least one side wall 112 surrounding a central chamber 125, and a contact structure 115 located at an upper end 114 of side wall 112. Contact structure 115 defines an opening 117 that communicates with central chamber 125 to facilitate insertion of stud bump 150 along a central axis X.

According to an aspect of the present invention that is described below in additional detail, contact structure 115 is formed such that when tip 157 of stud bump 150 is inserted into central chamber 125, base section 151 and/or elongated body 152 of stud bump 150 abut contact structure 115 at multiple contact points. This multiple contact objective is achieved by providing several contact protrusions 116 that extend from side wall 112 toward opening 117. In particular, contact structure 115 is formed such that opening 117 defines a clover-like shape, with contact protrusions 116 forming convex portions of the clover shape that extend relatively close to central axis X, and concave portions 118 of contact structure 115 being located relatively far from central axis X. By providing multiple contact protrusions 116 arrayed around opening 117 in this manner, socket 100 ensures reliable electrical contact between stud bump 150 and socket 100, even if one contact point experiences an intermittent loss of contact, or increase in resistance.

Figure 2:
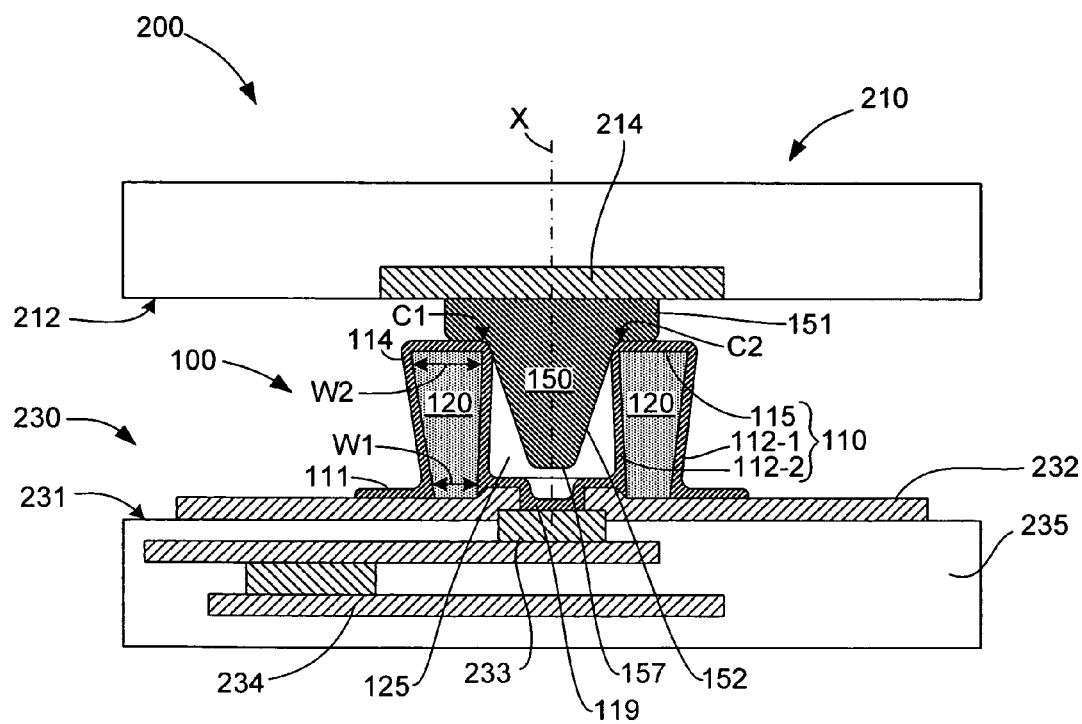
FIG. 2 is a perspective view showing an assembly including the socket and stud bump of FIG. 1.

FIG. 2 is a cross-sectional side view illustrating an assembly 200 illustrating the manner in which socket 100 facilitates a compliant, direct, reworkable connection between a host system (e.g., a printed circuit board (PCB)) 230 and an IC chip (electronic device) 210 for testing, burning in, and packaging.

Referring to the upper portion of FIG. 2, base section 151 of stud bump 150 is mounted onto a surface 212 of IC chip 210 such that base section 151 is in electrical contact with a die bonding pad 214. Those skilled in the art will recognize that die bonding pad 214 is electrically connected to associated I/O circuitry (not shown) that is provided on IC chip 210 according to known techniques. Note that, in FIG. 2, stud bump 150 is depicted in an enlarged form (i.e., relative to electronic device 210) for illustrative purposes. In one embodiment, the overall length of stud bump 150 (i.e., from surface 212 to tip 157) is approximately 25 microns. Other dimensions shown in the various figures are similarly distorted for illustrative purposes.

Socket 100 includes a patterned template structure 120 formed on an upper surface 231 of host system 230, and metal frame 110 comprises a metal layer formed (e.g., plated) over an outer surface of patterned template structure 120. As described in additional detail below, patterned template structure 120 is formed from a negative-acting photoresist material, and in the present embodiment comprises a continuous wall structure (i.e., a generally annular wall or a contiguous set of wall sections) surrounding central chamber 125. Note that central chamber 125 is substantially symmetrical around and defines central axis X, which in turn extends substantially perpendicular to surface 231 of host system 230. Metal frame 110 includes an outer base portion 111 formed on surface 231, an outer side wall 112-1 formed on an outside surface of template structure 120 and extending between lower end portion 111 and an upper end 114, an upper wall (contact structure) 115 extending over an upper end of patterned template structure 120, an inner side wall 112-2 formed on an inside surface of template structure 120 and extending downward from an inner edge of upper wall 115, and an inner base portion 119 connected to a lower edge of inner side wall 112-2 and formed on surface 231. Upper wall 115 defines clover shaped opening 117, as shown in FIG. 1, that communicates with central chamber 125, which is effectively defined by inner side wall 112-2 and inner base portion 119 of metal frame 110. Inner side wall 112-2 has a horizontal cross section that is essentially identical to clover shaped opening 117, thereby including concave and convex wall sections. The upper ends of the convex wall sections define concave portions 118 of upper wall 115, and the upper ends of the convex wall sections define convex sections (contact protrusions) 116 of upper wall 115. Accordingly, contact structure 115 and inner side wall 112-2 are formed such that, when the tip 157 of stud bump 150 is inserted through opening 117 into central chamber 125, at least one of base section 151 and elongated body 152 abut contact structure 115 at multiple contact points (e.g., as shown in FIG. 2, contact points C1 and C2) that correspond to the upper convex portions of inner side wall 112-2 and the innermost portions of contact protrusions 116, thereby providing the reliable connection between stud bump 150 and socket 100.

Note that host system 230 includes one or more contact pads (e.g., outer contact pad 232 and inner contact pad 233) exposed on upper surface 231 and contacted by at least one of outer base portion 111 and inner base portion 119 of metal frame 110. Host system 230 is constructed according to known printed circuit board (PCB) techniques to include a series of conductors 234 that are embedded in an insulating material 235 (e.g., CR4) for transmitting electrical signals between socket 100 and selected system electronics (not shown). In one embodiment, these system electronics include test equipment that is configured to transmit and/or receive test signals utilized by electronic device 210 according to known techniques.

In accordance with an embodiment of the present invention, patterned template structure 120 is formed from a negative acting photoresist material (e.g., SU-8) in the manner described in detail below. When such a negative acting material is used, the resulting wall structure exhibits a relatively narrow thickness W1 adjacent to its lower end (i.e., adjacent to upper surface 231 of host system 230), and a relative wide thickness W2 adjacent to its upper end (i.e., adjacent upper wall 115). This reentrant wall shape makes the overall size of socket 100 wider near upper end 114 than adjacent to base portion 111, which, in combination with the tapered shape of stud bump 150, allows stud bump 150 to center to socket 100 as stud bump 150 is inserted into central chamber 125, thus allowing contact pressure on stud bump 150 to develop as well.

In an alternative embodiment (not shown), the patterned template structure can be formed using an elastomeric material, such as Silicone (poly-dimethylsiloxane (PDMS)), but such a patterned structure may not provide the advantages of the reentrant wall shape described above.

In one embodiment, stud bump 150 is approximately 25 microns in length, and adjacent stud bumps in the predetermined pattern are separated by approximately 100 to 500 microns. In one embodiment, the depth of central chamber 125 of each socket 100 (i.e., measured along central axis X; see FIG. 1) exceeds length of stud bumps 150 in order to ensure that the contact points are between upper wall 115 of metal frame 110 and base portion 151 of each stud bump 150. In one embodiment, each socket 100 has a height of about 200 microns (or other suitable distance determined by the material used to form patterned template structure 120), and metal frame 110 is formed with a metal plate thickness of 10 microns. The resulting structure exhibits a deflection of about 5 microns during insertion. In one embodiment, metal frame 110 is plated Nickel (Ni), which ensures a contact force of about 0.2 grams at each contact point. By providing multiple contacts in this manner, and utilizing gold passivation, the resulting socket assembly should assure reliable electrical contact for some applications. Different geometries may be used to increase the spring constant of the socket if needed.

Figure 3:
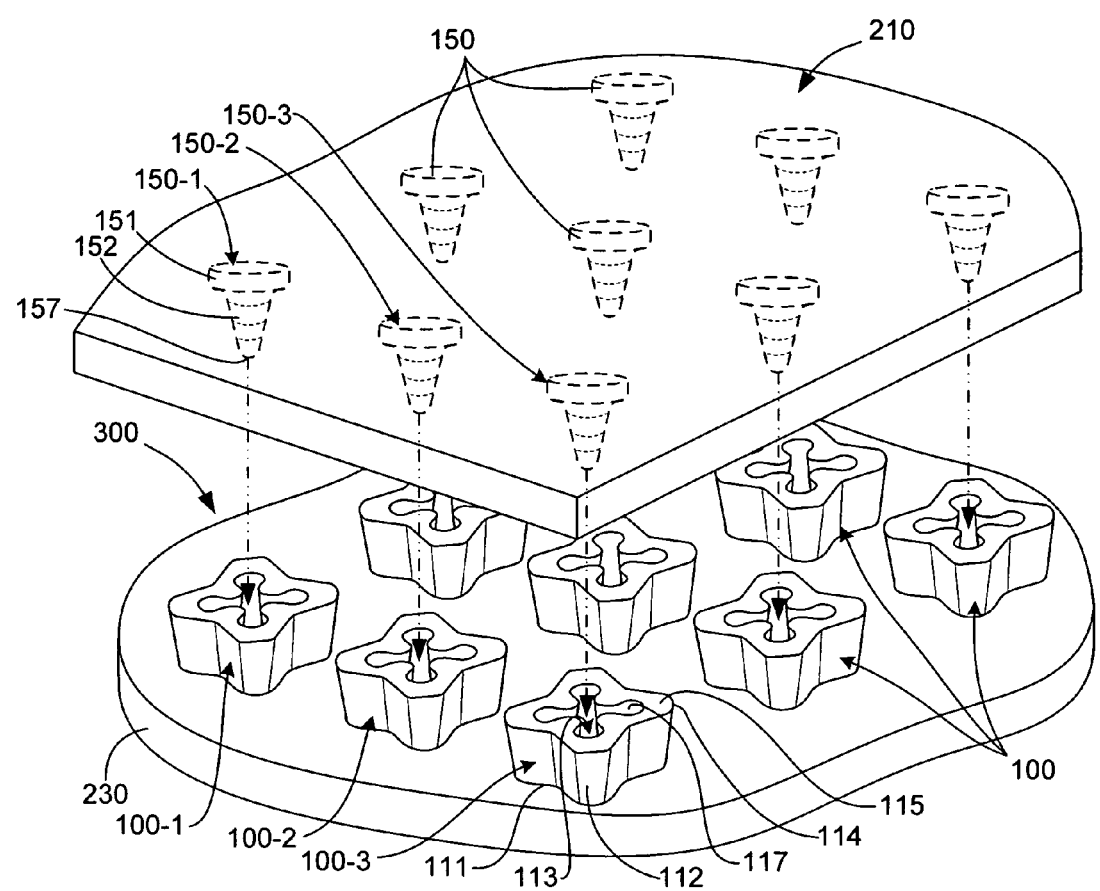
FIG. 3 is an exploded perspective view showing a socket array according to another embodiment of the present invention.

FIG. 3 is an exploded perspective view showing a socket array 300 formed on host system 230 for receiving and electrically connecting an electronic device 210 (e.g., a "flip-chip" IC device). Electronic device 210 includes an array of stud bumps 150 arranged in a predetermined pattern and mounted in the manner described above. As described above, each stud bump 150 (e.g., stud bump 150-1) includes an elongated body 152 extending between a base section 151 and a tip end 157. Socket array 300 includes multiple sockets 100 arranged on an upper surface of host system (substrate) 230 in the same pattern as that of stud bumps 150. As described above, each socket 100 (e.g., socket 100-3) includes a metal frame 110 having at least one side wall 112 including a fixed end 111 connected to the substrate surface, and a free end 114 positioned away from the substrate surface. Side wall 112 surrounding an elongated central chamber 125, and a contact structure 115 located at free end 114 of side wall 112 defines an opening 117 that communicates with central chamber 125. Each socket 100 of socket array 300 is constructed such that when tip end 157 of a corresponding stud bump 150 is inserted into its central chamber 125, at least one of the base section 151 and the elongated body 152 of the corresponding stud bump abuts the contact structure at multiple contact points.

In an exemplary embodiment, the area of each socket 100 of array 300 is approximately 150 by 150 microns. The realizable pitch of such an array would be on the order of several hundred microns. For area array interconnect this would be able to accommodate approximately one thousand sockets 100 on a 1 cm×1 cm die, although the present inventors envision the use of their invention on dies considerably smaller than 1 cm². For example, many components in handheld devices (e.g., personal digital assistants) are on the order of a fraction to a few square millimeters.

Preliminary calculations suggest that the assembly connections between the stud bumps (pins) and sockets would be highly reliable and substantially shock resistant. Assuming a coefficient of friction of 0.5, and four contact points per pin/socket connection, the insertion force for a 30 pin/socket array would be about 12 grams. The mass of the silicon die for such a part is only on the order of a few milligrams. A rudimentary model of the device is summarized below in Table 1. The computed properties indicate that it would take a shock of hundreds or thousands of g's to dislodge the IC chip from the host system, thereby indicating that socket array 300 provides a highly reliable connection structure. Note that one could always include a simple retaining clip or some corner bonds on the part (IC) or host to further improve the shock resistance of the socketed part, while still keeping it fairly easy to replace a failed part if needed.

TABLE 1

Rudimentary Socket Mechanical Model

| Input Parameters Dimensions | Computed Properties Computed Dimensions |
|---|---|
| Height: 200 um | Spring Constant: 0.04 gm/um |
| Width: 50 um | Contact Force: 0.20 gm |
| Thickness: 10 um | Insertion Force: 12.0 gm |
| Deformation: 5 um | |
| Contacts per pin: 4 | Pin Spacing: 258 microns |
| Chip Area: 2 mm² | Chip Mass: 0.00233 gm |
| Number of Pins: 30 | Dislodge acceleration: 5132 g's |
| Chip Thickness: 0.5 mm | |
| Material: Nickel | |
| Material Modulus: 250 GPa | |
| Friction Coefficient: 0.5 | |
| Si density: 2.33 gm/cm³ | |

In addition to providing a highly reliable and shock-resistant solderless connection structure, socket array 300 accommodates thermal expansivity mismatch and mechanical imperfections of the associated stud bump pattern, thereby facilitating repeatable connections between electronic device 210 and host system 230 under a variety of conditions, some of which are described below with reference to FIGS. 4(A) and 4(B).

Figure 4A:
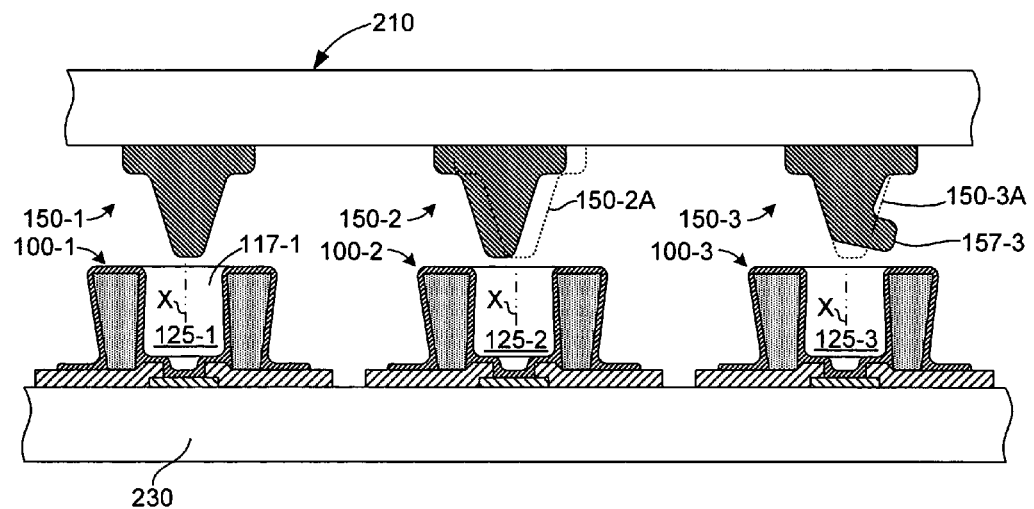
FIGS. 4(A) and 4(B) are cross sectional side views showing a row of the array of FIG. 3 during a mounting process.
Figure 4B:
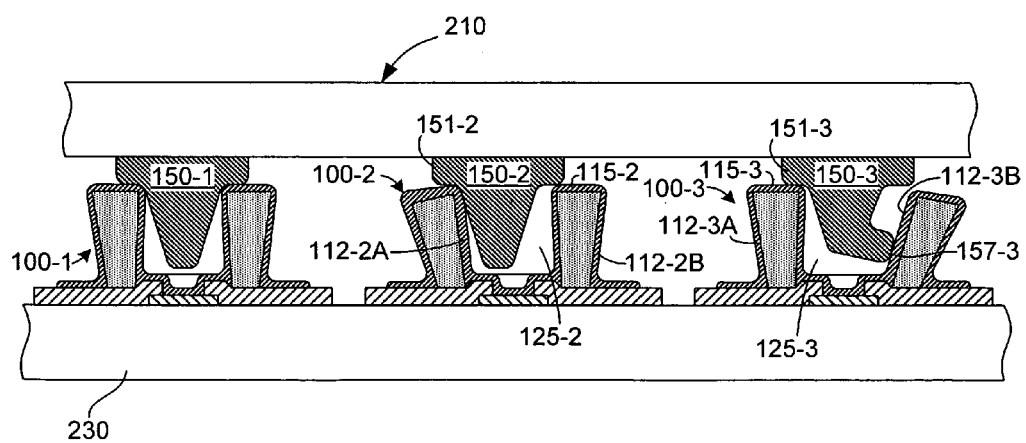

FIGS. 4(A) and 4(B) are cross sectional side views showing a row of array 300 (FIG. 3) including sockets 100-1 through 100-3 and stud bumps 150-1 through 150-3. Referring to the left side of FIG. 4(A), socket 100-1 and stud bump 150-1 represent the nominal arrangement in which stud bump 150 is substantially aligned with the axis X of central chamber 125-1, and the connection process proceeds substantially as described above to produce the multiple contact connection indicated in FIG. 4(B) and described in detail above. In contrast, as indicated in the center of FIG. 4(A), the location of stud bump 150-2 is slightly displaced from its ideal position (indicated by dashed outline 115-2A) due, for example, to thermal expansivity mismatch and/or mechanical imperfections (e.g., erroneous placement by the wire bonding tool). The socket array accommodates such alignment errors through the resilient deformation and the multiple contact point arrangement associated with the socket 100-2. In particular, as indicated in FIG. 4(B) due to its reentrant shape and compliant structure, side wall 112-2A deforms to accommodate the misalignment of stud bump 150-2 as it enters central cavity 125-2, thereby providing at least one reliable connection between base section 151-2 and contact structure 115-2. Referring to the right side of FIG. 4(A), stud bump 150-3 includes a tip 157-3 that is bent away from the ideal shape (indicated by dashed outline 115-3A) due to mechanical imperfection arising during or after the modified wire-bonding production process. The socket structure of the present invention accommodates such imperfections by deforming to accommodate bent tip 157-3 as it enters central cavity 125-3, thereby providing reliable connections between at least one of tip 157-3 and inner side wall 112-3B, and/or base section 151-3 and upper wall 115-3. Note that the resilient nature of sockets 100-1 through 100-3 facilitate repeated removal and insertion of stud bumps 150-1 through 150-3, thereby facilitating the reworking of the assembly without having to heat, clean, and resolder the connection.

An exemplary manufacturing process for producing socket 100 (described above) will now be described with reference to FIGS. 5(A) through 8(C).

Figure 5A:
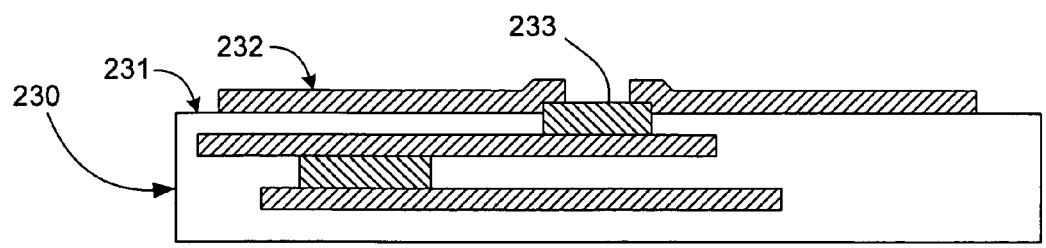
FIGS. 5(A), 5(B) and 5(C) are cross sectional side views showing the deposition of a negative-acting material and subsequent formation of a mask pattern during the fabrication of a patterned template structure according to an embodiment of the present invention.
Figure 5B:
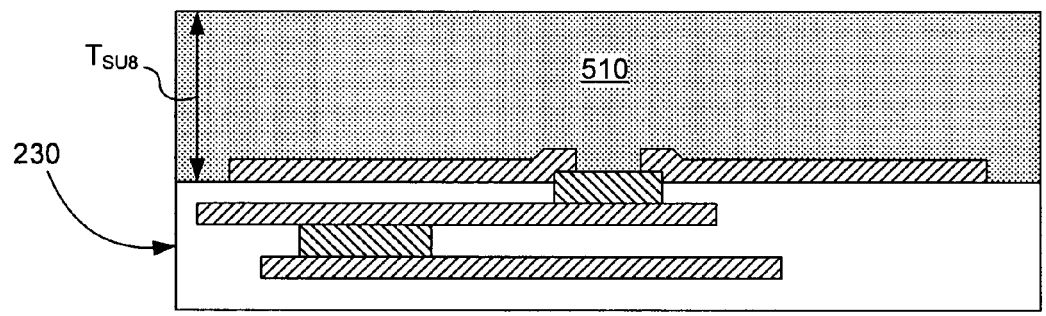
Figure 5C:
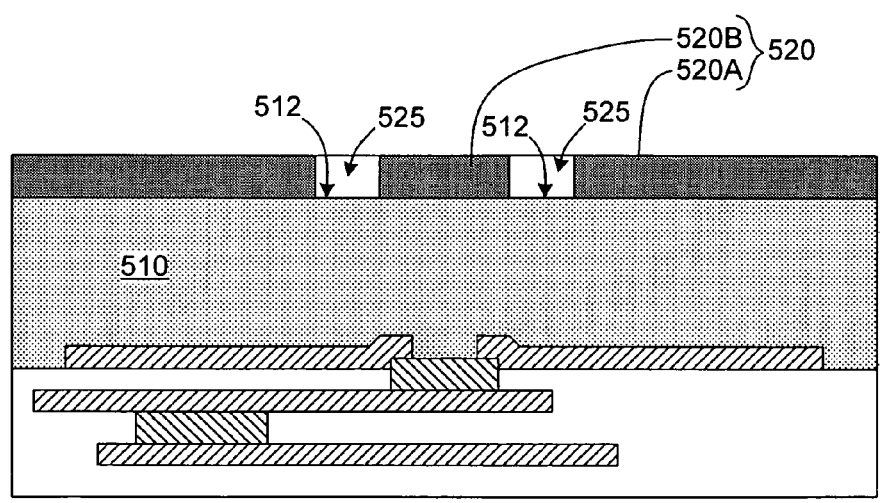

FIGS. 5(A), 5(B) and 5(C) are cross sectional side views respectively depicting the deposition of a negative-acting photoresist material layer 510 over upper surface 231 and contact pads 232 and 233 of host system 230, and the subsequent formation of a mask pattern 520 on an upper surface 515 of layer 510 (FIG. 5(C)). In one embodiment, the negative-acting photoresist material used to form layer 510 comprises a negative, epoxy-based photoresist material such as SU-8 having a thickness $T_{SU-8}$ of approximately 200 microns. SU-8 is typically applied in liquid form, so it starts with a high degree of planarity. The SU-8 can be applied over a wide range of thicknesses depending on the spin speed and viscosity during the application process.

Figure 6:
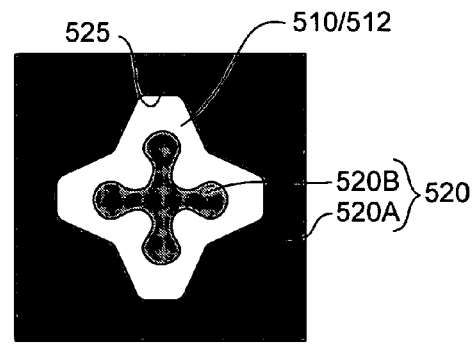
FIG. 6 is a top plan view showing a mask pattern utilized in the process of FIG. 5(C)

As indicated in FIGS. 5(C) and 6 (which is a top plan view), mask 520 is patterned to include a main mask portion 520A defining a window 525, and a clover-shaped mask portion 520B that is centered inside of window 525. Note that a patterned surface region 512 of negative-acting photoresist material layer 510 is exposed through window 525.

Figure 7A:
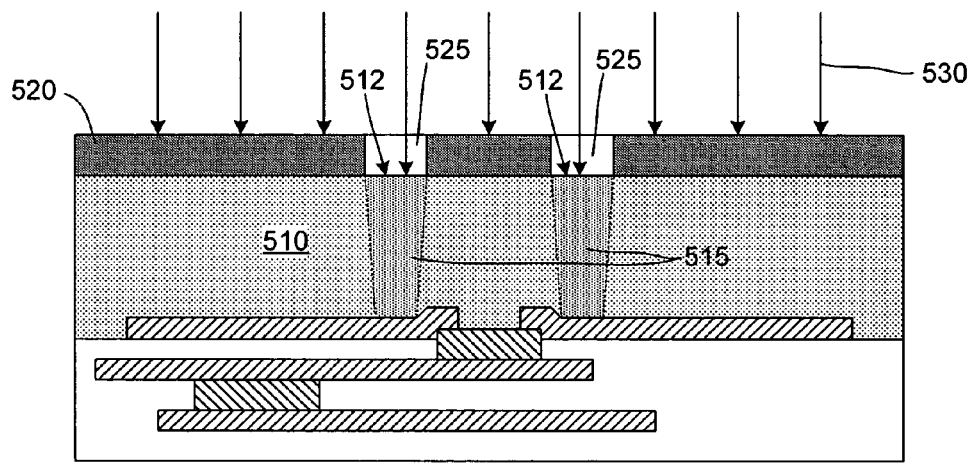
FIGS. 7(A) and 7(B) are cross sectional side views showing the development and subsequent removal of negative-acting material to form a patterned template structure.
Figure 7B:
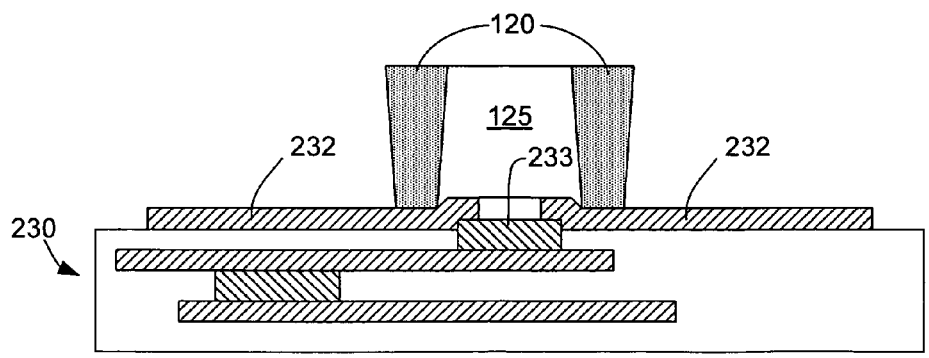

FIGS. 7(A) and 7(B) are cross sectional side views showing the development and subsequent removal of the material layer to complete the fabrication of the patterned template structure 120. As indicated in FIG. 7(A), sections 515 of material layer 510, which lay below exposed patterned surface region 512, are subjected to illumination by way of light beams 530. Note that, due to the gradually diminishing light exposure, sections 515 have a tapered (reentrant) shape in which the upper regions (i.e., adjacent surface region 512) are wider than the lower regions. Mask 520 and the underlying, non-exposed regions of material layer 510 are then removed according to known techniques, thereby leaving patterned template structure 120 (FIG. 7(B)) on host system 230. Note that patterned template structure 120 is formed on or adjacent to contact pads 232, and or define central chamber 125, which exposes central contact pad 233.

Figure 8A:
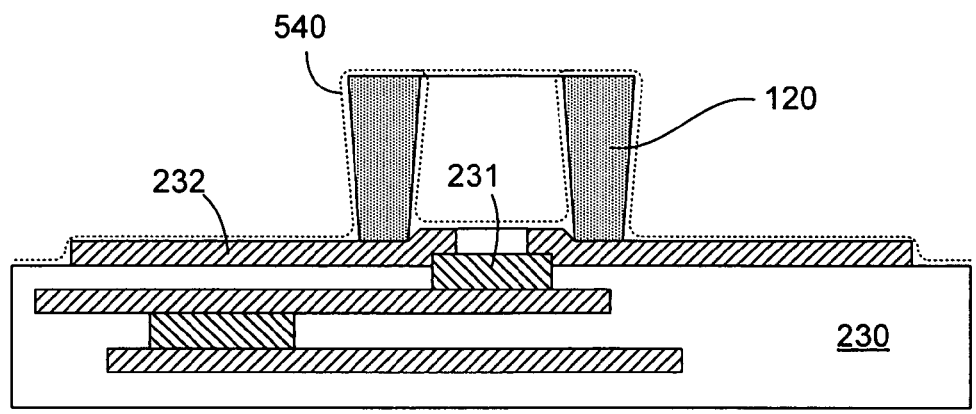
FIGS. 8(A), 8(B), 8(C) are cross sectional side views showing the formation of a metal frame over the patterned template structure of FIG. 7(B) according to an embodiment of the present invention.
Figure 8B:
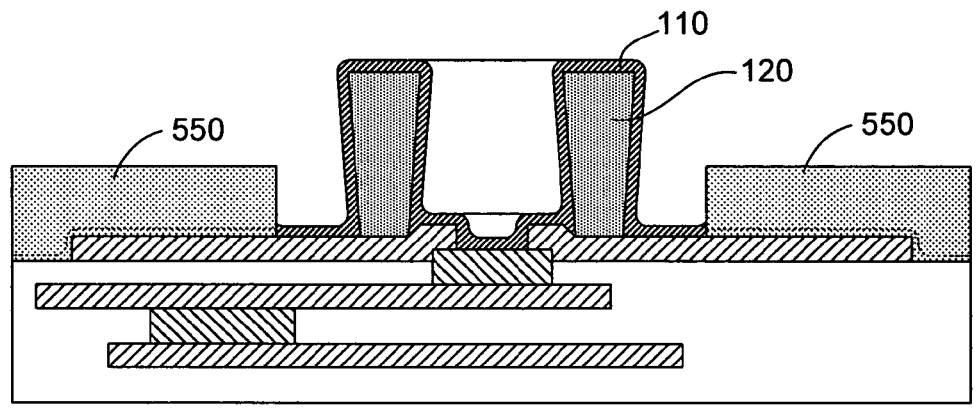
Figure 8C:
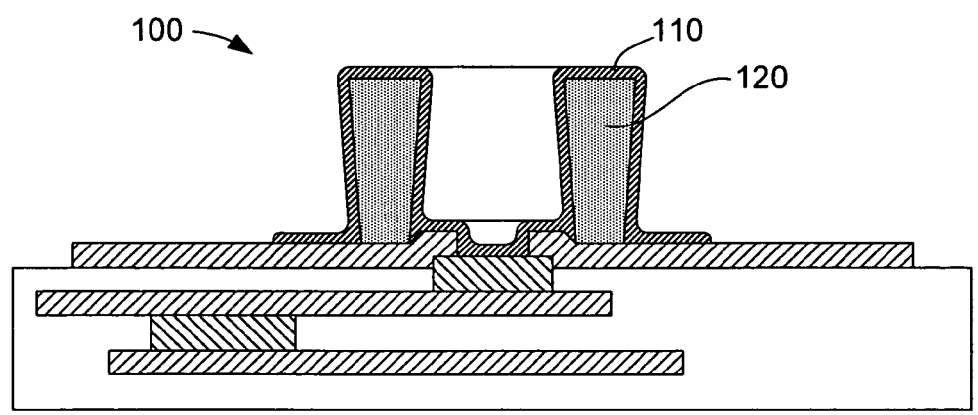

FIGS. 8(A) through 8(C) are cross sectional side views depicting the formation of a metal frame over patterned template structure 120 according to another aspect of the present invention. First, as shown in FIG. 8(A) an optional seed layer 540 is formed over patterned template structure 120, contact pads 232 and 233, and other exposed structures and surfaces of host system 230. A sputtered seed can be used to electroplate onto the SU-8. Patterned initiators could also be used for electroless plating. Referring to FIG. 8(B), a plating mask 550 is then formed around patterned template structure 120, and metal frame 110 is then formed over patterned template structure 110 and the surrounding exposed structures by electroplating or electroless plating. Nickel phosphorous passivated with gold is a suitable candidate for the plated connector metallurgy, but other possibilities will be apparent to skilled practitioners. Some versions of plating, including electroplating, tend to deposit metal faster at sharp features. This could be used to advantage to produce a structure with reentrant sidewalls, as it will produce thicker metal on the upper surface of patterned template structure 120 and other horizontal surfaces, and thinner metal along the relatively vertical side wall surfaces. As indicated in FIG. 8(C), the manufacturing process of socket 100 by removing the plating mask and underlying seed material, e.g., by etching, from around metal frame 110 and patterned template structure 120.

Placing resist onto a high aspect, reentrant structure, such as the various socket structures proposed herein, might be considered problematic. Spray coated resist could be considered as one option. Recent discussions have revealed, however, that equipment has been developed for reliably and inexpensively coating parts with electrodeposited resist. In this process, photoresist coats any metal surface that is electrically connected to the cathode of the resist depositing system.

Figure 9A:
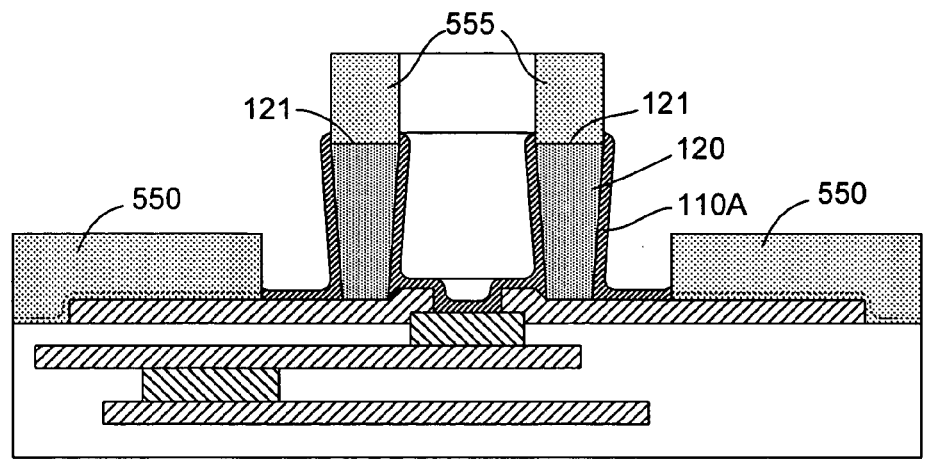
FIGS. 9(A), 9(B), 9(C) are cross sectional side views showing the formation of a metal frame according to an alternative embodiment of the present invention.
Figure 9B:
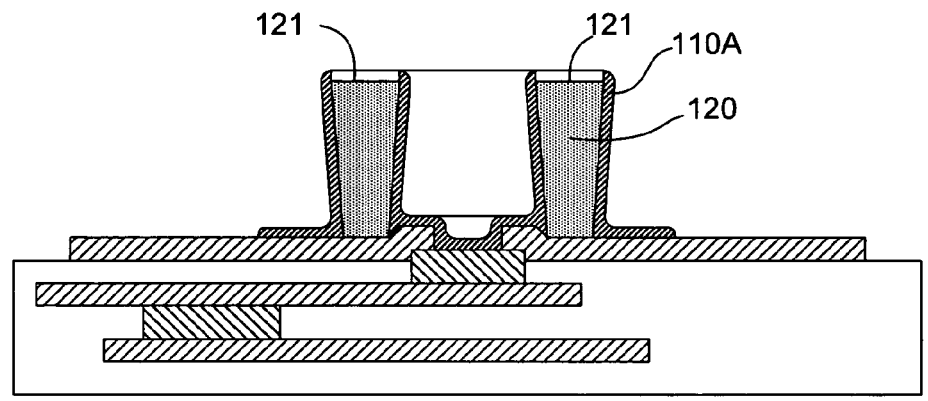
Figure 9C:
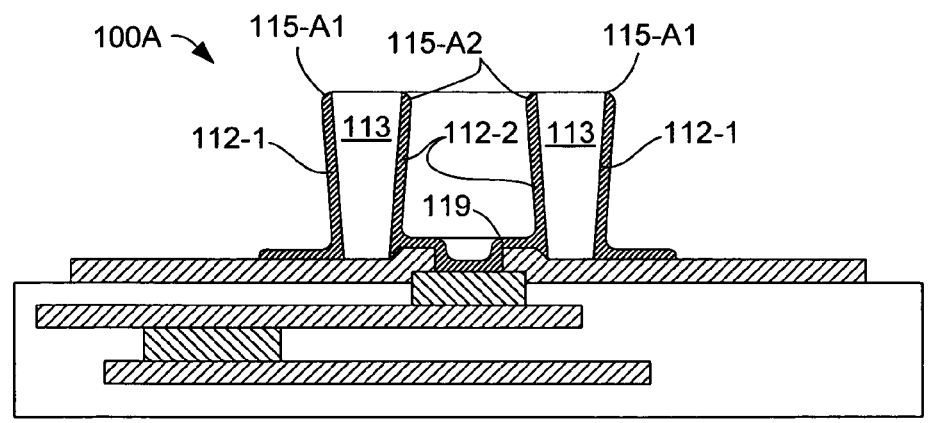

FIGS. 9(A) through 9(C) are cross sectional side views showing the formation of a socket 100A (FIG. 9(C)) having an alternative free-standing metal frame 110A according to an other embodiment of the present invention. This embodiment recognizes that there are methods for and potential advantages to making a socket structure in which the internal polymer framework is removed, either fully or partially from the completed socket structure. As indicated in FIG. 9(A), when plating mask 550 is formed as described above with reference to FIG. 8(A), mask portions 555 are formed on an upper surface 121 of patterned template structure 120. Subsequent formation of metal frame 110A produces an open-ended structure in which upper surface 121 remains free of plated metal. Subsequent removal of the masking material (and seed material) leaves the structure shown in FIG. 9(B); i.e., where patterned template structure 120 is exposed through metal frame 110A by way of upper surface 121. As indicated in FIG. 9(C), patterned template structure 120 is then removed using an etchant or solvent that enters through the open upper end of metal frame 110A and clears away the material from between outer side wall 112-1 and inner side wall 112-2, thereby forming a groove 113. Note that, in this embodiment, contact structures 115-A1 and 115-A2 are formed by the upper edges of outer side wall 112-1 and 112-2, respectively, with contact structure 115-A2 providing the primary contact structure for socket 100A. Note also that contact structure 115-A2 may be enhanced by forming smaller mask portions 555 that expose portions of patterned template structure 120, thereby resulting in horizontal flange structures that extend outward from the upper edges of inner side walls 112-2. Moreover a single-wall socket structure may be formed by extending the masking material between mask portions 550 and 555, thereby preventing the formation of outer side wall 112-1 (i.e., such that plated material is only retained on the inside surface of patterned template structure 120, and the resulting socket includes only inner wall 112-2, inner base portion 119, and a horizontal flange structure extending from the upper edge of inner wall 112-2, if provided). The potential advantages of socket 100A include less internal stress during thermal cycling and greater flexibility. These features could prove to be advantageous particularly for structures that undergo solder reflow, either for soldering the socketed components themselves, or other parts on the same board.

There are a couple of ways that sockets of the present invention could be used for test or burn-in for purposes of verifying an IC chip, and then producing a complete metallurgical contact through soldering. One possible method involves tinning either the stud bump, the socket, or both the stud bump and socket with plated solder, and then reflowing the solder once the IC chip performance is verified.

Sockets produced in accordance with the present invention are fairly scalable to smaller dimensions and higher density than those of the exemplary embodiments discussed above. For example, the stud bumps could be replaced with plated columns, and the lateral dimensions of the socket could be scaled down. The limit on scaling may stem from the tolerances of the components, and the placement accuracy of the tool that brings the parts together.

Further, while the exemplary embodiments described above are directed to sockets having clover-shaped openings, other socket structures may be produced that incorporate the spirit and scope of the present invention. Several such alternative socket structures are introduced below with reference to FIGS. 10 through 15.

Figure 10:
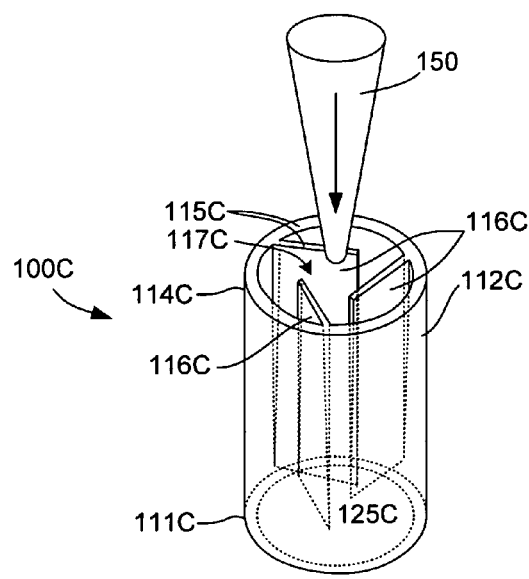
FIG. 10 is a perspective view showing a socket and stud bump according to another embodiment of the present invention.

FIG. 10 is a perspective view showing a socket 100C and stud bump 150 according to another embodiment of the present invention. Socket 100C includes a metal frame 110C having a relatively thick (e.g. 10–50 micron), substantially cylindrical wall 112C surrounding a central cavity (chamber) 125C, and several relatively narrow (e.g. 1–5 microns) flexible membranes 116C extending from main wall 112C into central cavity 125C. Cylindrical wall 112C defines an opening 117C at its upper end 114C that communicates with central cavity 125C. An upper edge 115C and/or flexible membranes 116C form the contact structure of socket 100C. In one embodiment, cylindrical wall 112C and membranes 116C are formed using a negative-acting photoresist material (e.g., SU-8) such that these structures define reentrant cross-sections that are wider near upper end 114C and narrower near lower end 111C. By carefully selecting an appropriate width, membranes 116C can be formed such that they are not anchored to the underlying substrate due to the reentrant profile of the negative-acting photoresist, thereby providing additional flexibility to membranes 116C. The resulting structure is then over-plated (or partially over-plated) with a metal such as nickel and/or gold in the manner described above.

Figure 11A:
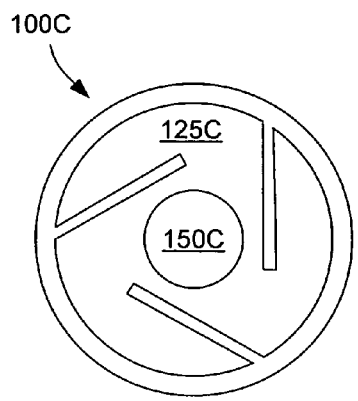
FIGS. 11(A) and 11(B) are top plan views showing the socket of FIG. 10 during use.
Figure 11B:
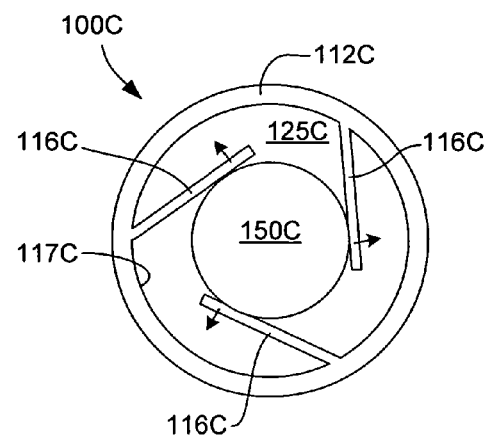

FIGS. 11(A) and 11(B) are top plan views showing socket 100C during use. FIG. 11(A) shows a point during the insertion process when a relatively narrow portion of stud bump 150 has entered central cavity 125C. As indicated in FIG. 11(B), as stud bump 150 is inserted further into central cavity 125C, the wider outer wall of stud bump 150 contacts and presses against flexible membranes 116C, thereby forcing membranes 116C outward toward cylindrical wall 112C (i.e., in the direction indicated by the arrows). Note that the wide opening 117C defined by main wall 112C and the flexibility of membranes 116C facilitate relaxing the lateral positioning accuracy of stud bumps 150.

Figure 12A:
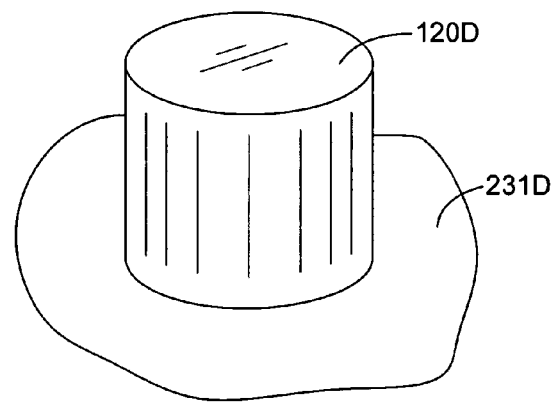
FIGS. 12(A), 12(B), and 12(C) are perspective views showing fabrication of a socket according to an embodiment of the present invention.
Figure 12B:
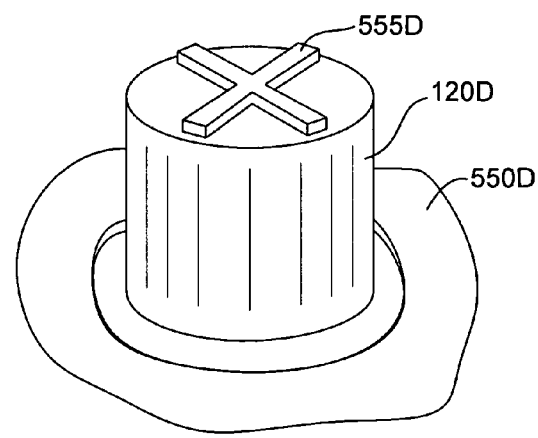
Figure 12C:
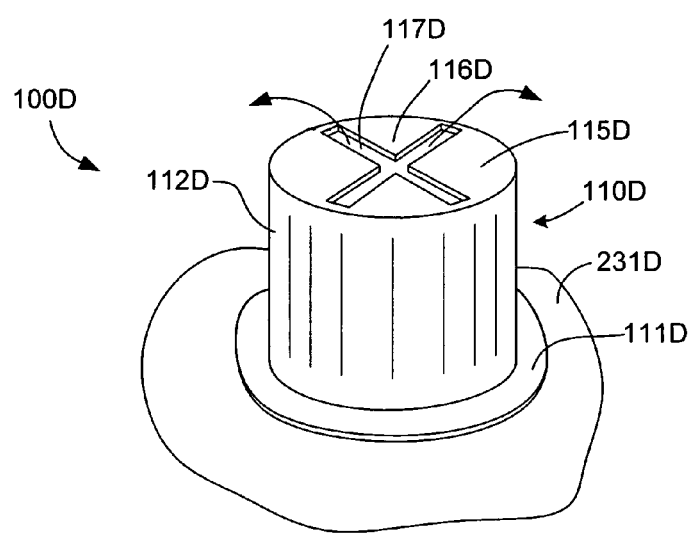

FIGS. 12(A) through 12(C) are perspective views showing fabrication of another socket according to yet another embodiment of the present invention. The process begins by forming a column 120D of sacrificial material on a host system surface 231D according to any of the methods described above (FIG. 12(A)). Next, as indicated in FIG. 12(B), a plating mask is provided that includes a peripheral portion 550D surrounding column 120D, and an X-shaped portion 555D that is patterned on an upper surface of column 120D. A metal frame 110D is then formed by plating a metal layer over the exposed portions of column 120D and removing the plating mask. As indicated in FIG. 12(C), the resulting metal frame 110D includes a base portion 111D, a substantially cylindrical side wall 112C surrounding the cylindrical template structure, and an upper wall (contact structure) 115D that includes several wedge-shaped contact structures 116D extending inward from upper edge 114D and separated by an X-shaped opening formed by radial grooves 117C. After forming metal frame 110D, the sacrificial material used to form column 120D (e.g., shown in FIG. 12(A)) is then dissolved or otherwise removed through radial openings 117C, thereby forming a hollow cavity inside of metal frame 110D.

FIGS. 13(A) and 13(B) are cross sectional side views showing socket 100D during use. In particular, these figures show stud bump 150 as tip 157 is pressed against upper wall 115D, thereby causing cantilevered contact structures 116D to deflect downward into a central chamber 125D defined by cylindrical side wall 112D and upper wall 115D.

FIG. 14 is a top plan view showing a socket 100E according to yet another embodiment of the present invention. Socket 100E includes an upper wall 115E of a metal frame that is separated into eight wedge-shaped contact structures 116E separated by radial grooves 117E that operate substantially as described above with reference to FIG. 13(B). Those skilled in the art will recognize that by forming an arbitrary number of radial grooves, a socket having any number of wedge-shaped contact structures can be produced.

FIG. 15 is a top plan view showing a socket 100F according to yet another embodiment of the present invention. Socket 100F includes a metal frame 110F similar to that described above with reference to FIG. 14, and includes substantially rectangular cantilevered contact structures 116F are formed in parallel and are separated by parallel grooves 117F. By offsetting the ends of cantilevered contact structures 116F in the manner shown in FIG. 15, a highly reliable contact structure is provided due to the increased likelihood that a stud bump will be contacted in two or more locations.

Although the present invention has been described with respect to certain specific embodiments, it will be clear to those skilled in the art that the inventive features of the present invention are applicable to other embodiments as well, all of which are intended to fall within the scope of the present invention. For example, while several sockets are described above with specific reference to cylindrical side walls, those skilled in the art will recognize that such side walls can be replaced with other contiguous wall arrangements such as oval walls and a contiguous series of straight walls arranged, for example, to form a square, pentagonal, or hexagonal structure. In addition, the specific contact structure geometries indicated in FIGS. 14 and 15 are intended to be exemplary, and may be modified to include, for example, curved spiral structures or zigzag structures. In addition, instead of vertical side walls, these structures may be formed with inward-slanting (positive sloped) sidewalls to allow for some compliant flexure involving the vertical length of the structure, which is further enhanced by forming slots that extend down the slanted side walls of the structure (i.e., such that base of the contact structures is located on the side walls). Moreover, the term "stud bump" as used herein is not intended to be limited to structures formed by modified wire bonding techniques, but also extends to similar metal structures, such as metal posts formed by electroplating. Finally, the reentrant wall structure described above may be formed using methods other than negative-acting resist materials, such as by image reversal, angular exposure, and variable depth of focus exposure.

The invention claimed is:

1. A socket for electrically connecting a stud bump mounted thereon, the stud bump including a base section and an elongated body extending between the base section to a tip end, the socket comprising a metal frame including an inner side wall portion surrounding a central chamber, an outer side wall portion surrounding the inner side wall portion such that the inner side wall portion is separated from the outer side wall portion, and a contact structure located at an upper end of the inner side wall, the contact structure defining an opening that communicates with the central chamber, wherein when the tip end of the stud bump is inserted into the central chamber, at least one of the base section and the elongated body of the stud bump abut the contact structure at two or more contact points.

2. The socket according to claim 1, wherein the contact structure comprises a plurality of contact protrusions extending toward the opening.

3. The socket according to claim 1, further comprising a patterned template structure, wherein the metal frame comprises a metal layer formed on a surface of the patterned template structure.

4. The socket according to claim 3,
wherein the patterned template structure comprises a continuous wall surrounding the central chamber,
wherein the inner side wall portion is formed on an inside surface of the continuous wall, and the outer side wall portion is formed on an outside surface of the continuous wall, and
wherein the contact structure comprises an upper wall of the metal frame extending between the inner side wall and the outer side wall.

5. The socket according to claim 1,
wherein the inner side wall comprises a clover shaped cross-section including concave sections located relatively far from an axis defined by the central chamber, and convex sections located relatively close to the axis, and
wherein the upper wall includes contact protrusions extending over the convex sections of the inner side wall.

6. The socket according to claim 3, wherein the patterned template structure defines a reentrant wall structure.

7. The socket according to claim 6, wherein the patterned template structure comprises a negative-acting photoresist material.

8. The socket according to claim 6, wherein the negative acting material comprises SU-8.

9. The socket according to claim 6, wherein the patterned template structure comprises walls having a relatively narrow thickness adjacent to a lower end, and a relative wide thickness W2 adjacent to the upper end.

10. The socket according to claim 3, wherein the patterned template structure comprises an elastomeric material.

11. The socket according to claim 1, wherein the metal frame further comprises a lower wall portion connected to a lower end of the inner side wall portion.

12. The socket according to claim 11,
wherein the inner side wall portion comprises a clover shaped cross-section including concave sections located relatively far from an axis defined by the central chamber, and convex sections located relatively close to the axis, and
wherein the contact structure comprises an upper edge of the inner side wall portion at said convex sections.

13. The socket according to claim 1, wherein the contact structure comprises a plurality of flexible membranes extending from the inner side wall portion into the central chamber.

14. The socket according to claim 13, wherein each of the plurality of flexible membranes has a relatively narrow thickness adjacent to a lower end of the inner side wall portion wall, and a relative wide thickness adjacent to the upper end of the inner side wall portion wall.

15. An assembly comprising:
an electronic device including a stud bump, the stud bump including a base section attached to a surface of the electronic device, a tip end positioned away from the surface, and an elongated body extending between the base section and the tip end; and
a host system including:
a substrate; and
a socket mounted on a surface of the substrate, the socket comprising a metal frame including:
at least one side wall having a fixed end connected to the substrate surface and a free end positioned away from the substrate surface, the at least one side wall surrounding an elongated central chamber, and
a contact structure located at the free end of the at least one side wall, the contact structure defining an opening that communicates with the central chamber,
wherein the electronic device is connected to the host system such that the tip end of the stud bump is inserted through the opening into the central chamber of the socket, and such that the contact structure of the socket abuts at least one of the base section and the elongated body of the stud bump at two or more contact points.

16. A socket array for electrically connecting an electronic device including a plurality of stud bumps extending therefrom, the plurality of stud bumps being arranged in a predetermined pattern, each of the stud bumps including a base section and an elongated body extending between the base section to a tip end, the socket array comprising:
a substrate; and
a plurality of sockets arranged in the predetermined pattern on a surface of the substrate, each socket comprising a metal frame including:
at least one side wall having a fixed end connected to the substrate surface and a free end positioned away from the substrate surface, the at least one side wall surrounding an elongated central chamber, and
a contact structure located at the free end of the at least one side wall, the contact structure defining an opening that communicates with the central chamber,
wherein each socket of the socket array is constructed such that when the tip end of a corresponding stud bump is inserted into its central chamber, at least one of the base section and the elongated body of said corresponding stud bump abuts the contact structure at two or more contact points.

* * * * *

UNITED STATES PATENT AND TRADEMARK OFFICE
CERTIFICATE OF CORRECTION

PATENT NO. : 7,118,389 B2  Page 1 of 1
APPLICATION NO. : 10/871330
DATED : October 10, 2006
INVENTOR(S) : David K. Fork et al.

It is certified that error appears in the above-identified patent and that said Letters Patent is hereby corrected as shown below:

Column 1, line 2, insert as a new paragraph:

This invention was made with Government support under 70NANB8H4008 awarded by NIST. The Government has certain rights in this invention.

Signed and Sealed this

First Day of May, 2007

JON W. DUDAS
*Director of the United States Patent and Trademark Office*